United States Patent
Koga et al.

(10) Patent No.: US 10,094,330 B2
(45) Date of Patent: Oct. 9, 2018

(54) RUBBER-METAL LAMINATED GASKET MATERIAL

(71) Applicant: NOK Corporation, Tokyo (JP)

(72) Inventors: Akiko Koga, Kanagawa (JP); Akihiro Suzuki, Tottori (JP)

(73) Assignee: NOK Corporation, Tokyo (JP)

( * ) Notice: Subject to any disclaimer, the term of this patent is extended or adjusted under 35 U.S.C. 154(b) by 173 days.

(21) Appl. No.: 15/304,298

(22) PCT Filed: Apr. 10, 2015

(86) PCT No.: PCT/JP2015/061239
§ 371 (c)(1),
(2) Date: Oct. 14, 2016

(87) PCT Pub. No.: WO2015/159818
PCT Pub. Date: Oct. 22, 2015

(65) Prior Publication Data
US 2017/0037811 A1  Feb. 9, 2017

(30) Foreign Application Priority Data

Apr. 16, 2014 (JP) .................................. 2014-084274

(51) Int. Cl.
| | |
|---|---|
| *F02F 11/00* | (2006.01) |
| *B32B 7/12* | (2006.01) |
| *B32B 15/06* | (2006.01) |
| *B32B 25/14* | (2006.01) |
| *B32B 33/00* | (2006.01) |
| *B32B 15/18* | (2006.01) |
| *C09K 3/10* | (2006.01) |
| *B32B 25/18* | (2006.01) |
| *B32B 1/08* | (2006.01) |
| *C23C 16/26* | (2006.01) |

(52) U.S. Cl.
CPC .............. *F02F 11/002* (2013.01); *B32B 1/08* (2013.01); *B32B 7/12* (2013.01); *B32B 15/06* (2013.01); *B32B 15/18* (2013.01); *B32B 25/14* (2013.01); *B32B 25/18* (2013.01); *B32B 33/00* (2013.01); *C09K 3/1006* (2013.01); *C09K 3/1009* (2013.01); *C23C 16/26* (2013.01); *B32B 2255/10* (2013.01); *B32B 2255/20* (2013.01); *B32B 2307/536* (2013.01); *B32B 2581/00* (2013.01); *C09K 2003/1096* (2013.01); *C09K 2200/0612* (2013.01)

(58) Field of Classification Search
CPC .......................... B32B 15/06; B32B 2581/00
See application file for complete search history.

(56) References Cited

U.S. PATENT DOCUMENTS

| | | |
|---|---|---|
| 4,956,226 A | 9/1990 | Ashizawa et al. |
| 5,004,650 A | 4/1991 | Ashizawa et al. |
| 2010/0190018 A1 | 7/2010 | Higashira et al. |

FOREIGN PATENT DOCUMENTS

| | | |
|---|---|---|
| CN | 101784349 A | 7/2010 |
| JP | 1-252686 A | 10/1989 |
| JP | 2-29484 A | 1/1990 |
| JP | 10-053870 | 2/1998 |
| JP | 2000-006308 A | 1/2000 |
| JP | 2000-272045 | 10/2000 |
| JP | 2002-047479 A | 2/2002 |
| JP | 3316993 | 8/2002 |
| JP | 2004-076699 | 3/2004 |
| JP | 2004-076911 | 3/2004 |
| JP | 2005-002377 | 1/2005 |
| JP | 3637912 | 1/2005 |
| JP | 2008-081239 | 4/2008 |
| JP | 2009-084453 A | 4/2009 |

OTHER PUBLICATIONS

Machine translation of JP 2002-047479A (Year: 2002).*
International Preliminary Report on Patentability and Written Opinion from corresponding PCT application No. PCT/JP2015/061239 dated Oct. 27, 2016 (8 pgs).
International Search Report from corresponding PCT application No. PCT/JP2015/061239 dated Jul. 14, 2015 (4 pgs).

* cited by examiner

*Primary Examiner* — Ramsey E Zacharia
(74) *Attorney, Agent, or Firm* — Brinks Gilson & Lione

(57) ABSTRACT

A rubber-metal laminated gasket material comprising a metal plate and fluororubber or nitrile rubber laminated on the metal plate, wherein an amorphous carbon film having a nanoindentation hardness on a silicon wafer of 10 GPa or more and a film thickness of 200 nm or more is formed on a rubber layer outer surface of the rubber-metal laminated gasket material by a plasma CVD method that supplies a high-frequency power from a high-frequency power source using unsaturated hydrocarbon gas. The rubber-metal laminated gasket material reduces the wear and abrasion of the gasket material due to friction with the seal mating surface under high temperature use.

9 Claims, No Drawings

RUBBER-METAL LAMINATED GASKET MATERIAL

RELATED APPLICATION

This application is a 35 U.S.C. § 371 national phase filing of International Patent Application No. PCT/JP2015/061239, filed Apr. 10, 2015, through which and to which priority is claimed under 35 U.S.C. § 119 to Japanese Patent Application No. 2014-084274, filed Apr. 16, 2014, the entire disclosure of which is hereby expressly incorporated by reference.

TECHNICAL FIELD

The present invention relates to a rubber-metal laminated gasket material, and more particularly to a rubber-metal laminated gasket material suitable to use for cylinder head gaskets, etc.

BACKGROUND ART

Rubber-metal laminated plates are conventionally used as engine cylinder head gaskets. As such a rubber-metal laminated plate, one in which a rubber composition is coated and laminated on a metal plate is used; however, when using a rubber-metal laminated plate in which the rubber surface is not subjected to any surface treatment, the wear resistance is low even at ordinary temperature. In particular, when this rubber-metal laminated plate is used as a cylinder head gasket, it may be worn out to cause leakage. In contract the present applicant has previously proposed that a fluororubber surface is coated with a surface-treating agent comprising a hydroxyl group-containing liquid polybutadiene, an isocyanate group-containing polybutadiene as a curing agent, and a polyolefin resin organic solvent dispersion (Patent Document 1). In this case, the wear resistance at ordinary temperature is excellent; however, the wear resistance tends to decrease after aging due to heat. For the application to gaskets to be used in a high temperature environment, a further improvement in the function is expected.

Patent Document 2 discloses an automotive sealing material in which a DLC (diamond-like carbon) film having wear resistance and lubricity is formed by a plasma CVD method on the surface of a substrate of the automotive sealing material on which a film comprising an organic material is to be formed; however, a fluorine termination treatment or hydrogen termination treatment is required as a pretreatment before the DLC film formation. This treatment is supposed to improve the adhesion of the carbon film and the sealing material substrate.

Further, as a technique for forming a DLC film having excellent adhesion on the surface of a polymer substrate, Patent Document 3 proposes that a carbon intermediate layer film is formed between the polymer substrate and the DLC film. Comparative Example 1 shows that the DLC film is peeled off when such an intermediate layer film is not formed.

PRIOR ART DOCUMENT

Patent Document

Patent Document 1: JP-B-3,316,993
Patent Document 2: JP-B-3,637,912
Patent Document 3: JP-A-2005-2377
Patent Document 4: JP-A-2000-272045
Patent Document 5: JP-A-2004-76699
Patent Document 6: JP-A-2004-76911

OUTLINE OF THE INVENTION

Problem to be Solved by the Invention

An object of the present invention is to provide a rubber-metal laminated gasket material comprising a metal plate and fluororubber or nitrile rubber laminated on the metal plate, wherein the wear and abrasion of the gasket material due to friction with the seal mating surface under high temperature use are reduced.

Means for Solving the Problem

The above object of the present invention can be achieved by a rubber-metal laminated gasket material comprising a metal plate and fluororubber or nitrile rubber laminated on the metal plate, wherein an amorphous carbon film having a nanoindentation hardness on a silicon wafer of 10 GPa or more, preferably 15 GPa or more, and a film thickness of 200 nm or more, preferably 400 nm or more, is formed on a rubber layer outer surface of the rubber-metal laminated gasket material by a plasma CVD method that supplies a high-frequency power from a high-frequency power source using unsaturated hydrocarbon gas.

Effect of the Invention

In the rubber-metal laminated gasket material according to the present invention, an amorphous carbon film that has a nanoindentation hardness on a silicon wafer of 10 GPa or more, preferably 15 GPa or more, and a film thickness of 200 nm or more, preferably 400 nm or more, is formed on a rubber layer outer surface by a plasma CVD method using unsaturated hydrocarbon gas; therefore, regardless of the presence or absence of a termination treatment using fluorine gas, hydrogen gas, or the like before the formation of an amorphous carbon film, as described in Patent Document 2 mentioned above, frictional coefficient can be reduced and wear resistance can be increased at ordinary temperature. Moreover, because the film composition is carbon, there is no deterioration by heat, which occurs in polymer coating; therefore, the rubber-metal laminated gasket material of the present invention has the excellent effects of improving the wear resistance in a high temperature environment and reducing stickiness under high temperature conditions. The rubber-metal laminated gasket material having such characteristics is suitably used as an engine cylinder head gasket, etc.

EMBODIMENTS FOR CARRYING OUT THE INVENTION

Examples of the metal plate include stainless steel plates, mild steel plates, aluminum plates, and aluminum die casting plates. Preferably usable are stainless steel plates such as SUS304, SUS301, SUS301H and SUS430. Because of use in gaskets, the plate thickness is generally about 0.1 to 2 mm.

In order to bond a metal plate and rubber, an adhesive layer is generally formed on the metal plate. Any adhesive can be used without limitation as long as it can bond rubber. Examples thereof include silane-based fluororubber adhesives commercially available as Chemlok AP-133 (produced by Lord Far East, Inc.), MetaLoc S-2 (produced by Toyokagaku Kenkyusho Co., Ltd.), Megum 3290-1 (produced by Rohm and Haas Company), and the like; or silane-based adhesives containing an organometallic compound. The adhesive is applied to a metal plate, which is preferably degreased, by dipping, spraying, brush coating, roll coating, or the like so that the coating weight is about 10 to 1,000 mg/m². The applied adhesive is dried at room temperature, followed by calcination at about 100 to 250° C. for about 1 to 20 minutes.

Further, when fluororubber is used as the rubber, a combination with a covercoat adhesive comprising a novolac type epoxy resin, a novolac type phenolic resin derived from p-unsubstituted phenol, and 2-ethyl-4-methylimidazole can be used (see Patent Documents 4 to 6). Moreover, when nitrile rubber is used as the rubber, a phenolic resin-based adhesive, which is commercially available as, for example, MetaLoc N31 (produced by Toyokagaku Kenkyusho Co., Ltd.), Thixon 715 (produced by Rohm and Haas Company), or Chemlok TS1677-13 or Chemlok 202 (produced by Lord Far East, Inc.), is generally applied as a covercoat adhesive. The covercoat adhesive is applied with a film thickness of about 1 to 15 μm, and then dried and calcined in the same manner as for the adhesive directly applied to the metal plate.

Alternatively, a metal plate and rubber can also be bonded to each other, without forming an adhesive layer, by adding an adhesive component mentioned above to a solvent solution of a rubber compound. The formulation contents are not particularly limited. Usable examples include a fluororubber compound to which an adhesive component is added (Formulation Example I, described later).

As the fluororubber, either polyol-crosslinkable or peroxide-crosslinkable fluororubber can be used. It is sufficient that the rubber layer to be obtained has a hardness (Durometer A; instant) of 80 or more (according to JIS K6253: 1997 corresponding to ISO 48) and a compression set (100° C., 22 hours) of 50% or less (according to JIS K6262: 2006 corresponding to ISO 815). The formulation contents are not particularly limited. Usable examples include fluororubber compounds of Formulation Examples II to IV, described later.

Examples of the polyol-crosslinkable fluororubber generally include copolymers of vinylidene fluoride with at least one of other fluorine-containing olefins, such as hexafluoropropene, pentafluoropropene, tetrafluoroethylene, trifluorochloroethylene, vinyl fluoride, and perfluoro(methyl vinyl ether); copolymers of the fluorine-containing olefin with propylene; and the like. The fluororubber is polyol-crosslinked using a polyol-based crosslinking agent and a crosslinking accelerator.

Polyol-based crosslinking agent includes, for example, 2,2-bis(4-hydroxyphenyl) propane [bisphenol A], 2,2-bis(4-hydroxyphenyl) perfluoropropane [bisphenol AF], bis(4-hydroxyphenyl)sulfone [bisphenol S], 2,2-bis-(4-hydroxyphenyl)methane [bisphenol F], bisphenol A-bis (diphenylphosphate), 4,4'-dihydroxydiphenyl, 2,2-bis(4-hydroxyphenyl)butane, etc., and bisphenol A, bisphenol AF, etc. are preferably used. These may be also in the form of alkali metal salts or alkaline earth metal salts. The polyol-based crosslinking agent can be used usually in a proportion of about 0.5 to about 15 parts by weight, preferably about 0.5 to about 6 parts by weight, based on 100 parts by weight of fluororubber.

As the crosslinking accelerator, a quaternary phosphonium salt, an equimolar compound of a quaternary phosphonium salt and an active hydrogen-containing aromatic compound, or the like is used; a quaternary phosphonium salt is preferably used. The quaternary phosphonium salts are compounds represented by the following general formula:

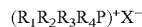

$(R_1R_2R_3R_4P)^+X^-$ where $R_1$ to $R_4$ are alkyl groups having 1 to 25 carbon atoms, alkoxyl groups, aryl groups, alkylaryl groups, aralkyl groups or polyoxyalkylene groups, two or three of which may form a heterocyclic structure together with N or P, and X is an anion of $Br^-$, $I^-$, $HSO_4^-$, $H_2PO_4^-$, $RCOO^-$, $ROSO_2^-$, $CO_3^{--}$, etc., and include, for example, tetraphenylphosphonium chloride, benzyltriphenylphosphonium bromide, benzyltriphenylphosphonium chloride, trioctylbenzylphosphonium chloride, trioctylmethylphosphonium chloride, trioctylethylphosphonium acetate, tetraoctylphosphonium chloride, etc.

Such a quaternary phosphonium salt is used in a proportion of about 0.1 to 10 parts by weight, preferably about 0.5 to 5 parts by weight, based on 100 parts by weight of fluororubber.

Moreover, examples of the peroxide-crosslinkable fluororubber include fluororubber containing iodine and/or bromine in the molecule. The fluororubber is crosslinked with an organic peroxide that is generally used in the peroxide crosslinking.

Examples of the organic peroxide include dicumyl peroxide, cumene hydroperoxide, p-methane hydroperoxide, 2,5-dimethylhexane-2,5-dihydroperoxide, di-tert-butyl peroxide, benzoyl peroxide, m-toluyl peroxide, 2,5-dimethyl-2,5-di(tert-butylperoxy)hexane, 2,5-dimethyl-2,5-di(tert-butylperoxy)hexyne-3,1,3-di(tert-butylperoxyisopropyl) benzene, 2,5-dimethyl-2,5-dibenzoylperoxyhexane, (1,1,3, 3-tetramethylbutylperoxy) 2-ethylhexanoate, tert-butyl peroxybenzoate, tert-butyl peroxylaurate, di(tert-butylperoxy)adipate, di(2-ethoxyethylperoxy)dicarbonate, bis-(4-tert-butylcyclohexylperoxy)dicarbonate, and the like. Such an organic peroxide is used in a proportion of 0.5 to 10 parts by weight, preferably 1 to 5 parts by weight, based on 100 parts by weight of peroxide-crosslinkable fluororubber.

For the peroxide crosslinking by organic peroxide, it is preferable to use a polyfunctional unsaturated compound in combination. As the polyfunctional unsaturated compound, a polyfunctional unsaturated compound that improves mechanical strength, compression set, etc., such as tri(meth) allyl isocyanurate, tri(meth)allyl cyanurate, triallyl trimellitate, N,N'-m-phenylene bismaleimide, diallyl phthalate, tris (diallylamine)-s-triazine, triallyl phosphite, ethyleneglycol di(meth)acrylate, diethyleneglycol di(meth)acrylate, neopentylglycol di(meth)acrylate, trimethylolpropane tri(meth) acrylate, 1,3-polybutadiene, and the like is used in a proportion of about 0.1 to 20 parts by weight, preferably about 0.5 to 10 parts by weight, based on 100 parts by weight of peroxide-crosslinkable fluororubber. Here, (meth)allyl refers to allyl or methallyl. Similarly, (meth)acrylate refers to acrylate or methacrylate.

Formulation Example I

| | |
|---|---|
| Fluororubber (Viton A-200, produced by DuPont) | 100 parts by weight |
| MT carbon black (N990) | 20 parts by weight |
| White carbon (Nipsil ER, produced by Toso-Silica Co.) | 10 parts by weight |
| Magnesium oxide (Magnesia #30, produced by Kyowa Chemical Co.) | 5 parts by weight |
| Amorphous graphite (A-O, produced by Nichiden Carbon Co.) | 30 parts by weight |

-continued

| | |
|---|---|
| Vulcanizing agent (Curative #30, produced by DuPont) | 10.7 parts by weight |
| Vulcanization accelerator (Curative #20, produced by DuPont) | 5.8 parts by weight |
| Epoxy group-containg silane coupling agent (SH-6040, produced by Dow Corning Toray Co., Ltd.) | 4.6 parts by weight |
| Epoxy-modified phenol resin (Epiclon N695, produced by Dainippon Ink & Chemicals) | 34.5 parts by weight |

Formulation Example II

| | |
|---|---|
| Fluororubber (Viton E60C, produced by DuPont) | 100 parts by weight |
| MT carbon black (produced by Cancarb Limited) | 30 parts by weight |
| Magnesium oxide (Magnesia #30, produced by Kyowa Chemical Industry Co., Ltd.) | 10 parts by weight |
| Crosslinking agent (Diak No. 3, produced by DuPont) | 3 Parts by weight |

Formulation Example III

| | |
|---|---|
| Fluororubber (Viton E45, produced by DuPont) | 100 parts by weight |
| Calcium metasilicate (produced by NYCO Minerals) | 40 parts by weight |
| MT carbon black (produced by Cancarb Limited) | 2 parts by weight |
| Magnesium oxide (Magnesia #150, produced by Kyowa Chemical Industry Co., Ltd.) | 6 parts by weight |
| Calcium hydroxide (produced by Ohmi Chemical Industry Co., Ltd.) | 3 parts by weight |
| Crosslinking agent (Curative #30, produced by DuPont) | 2 parts by weight |
| Crosslinking accelerator (Curative #20, produced by DuPont) | 1 part by weight |

Formulation Example IV

| | |
|---|---|
| Fluororubber (Daiel G901, produced by Daikin Industries, Ltd.) | 100 parts by weight |
| Calcium metasilicate (produced by NYCO Minerals) | 20 parts by weight |
| MT carbon black (produced by Cancarb Limited) | 20 parts by weight |
| Magnesium oxide (Magnesia #150) | 6 parts by weight |
| Calcium hydroxide (produced by Ohmi Chemical Industry Co., Ltd.) | 3 parts by weight |
| Triallyl isocyanurate (produced by Nippon Kasei Chemical Co., Ltd.) | 1.8 parts by weight |
| Organic peroxide (Perhexa 25B, produced by NOF Corporation) | 0.8 parts by weight |

NBR or hydrogenated NBR is used as the nitrile rubber, and it can also be used as a compound in which about 0.05 to 5 parts by weight of a sulfur-based vulcanizing agent, such as sulfur or tetramethylthiuram monosulfide, is used based on 100 parts by weight of (hydrogenated) nitrile rubber; however, it is preferably used as an unvulcanized nitrile rubber compound in which about 0.05 to 10 parts by weight of organic peroxide is used as a crosslinking agent. Examples of the peroxide-crosslinkable unvulcanized nitrile rubber compound include the following formulation examples. In this case, it is also preferable to use an organic peroxide together with about 0.05 to 10 parts by weight of a polyfunctional unsaturated compound, typically triallyl isocyanurate.

Formulation Example V

| | |
|---|---|
| NBR (N-237, middle-high nitrile, produced by JSR Corporation) | 100 parts by weight |
| HAF carbon black | 10 parts by weight |
| SRF carbon black | 40 parts by weight |
| Cellulose powder | 10 parts by weight |
| Zinc oxide | 10 parts by weight |
| Stearic acid | 1 part by weight |
| Microcrystalline wax | 2 parts by weight |
| Antioxidant (ODA-NS, produced by Ouchi Shinko Chemical Industrial Co., Ltd.) | 4 parts by weight |
| Plasticizers (Vulkanol OT, produced by Bayer) | 5 parts by weight |
| Organic peroxide (Perhexa 25B, produced by NOF Corporation) | 6 Parts by weight |
| N,N-m-phenylene dimaleimide | 1 part by weight |

Formulation Example VI

| | |
|---|---|
| NBR (N-235S, produced by JSR Corporation) | 100 parts by weight |
| SRF carbon black | 80 parts by weight |
| Calcium carbonate | 80 parts by weight |
| Silica powder | 20 parts by weight |
| Zinc oxide | 5 parts by weight |
| Antioxidant (Nocrac 224, produced by Ouchi Shinko Chemical Industrial Co., Ltd.) | 2 parts by weight |
| Triallyl isocyanurate | 2 parts by weight |
| 1,3-bis(tert-butylperoxy)isopropyl benzene | 2.5 parts by weight |
| Plasticizers (Vulkanol OT, produced by Bayer) | 5 parts by weight |

The uncrosslinked rubber layer that is applied to form a one side-crosslinked layer having a thickness of about 5 to 120 μm is dried at room temperature to about 100° C. for about 1 to 15 minutes to evaporate off alcohols such as methanol or ethanol, and ketones such as methyl ethyl ketone or methyl isobutyl ketone, which are used as the organic solvent or a mixed solvent thereof. Then, thermal-crosslinking is conducted at about 150 to 230° C. for about 0.5 to 30 minutes, and optionally crosslinking is performed under increased pressure.

An amorphous carbon film is formed by a plasma CVD method on the outer surface of the rubber layer formed on the metal plate via the adhesive layer.

The plasma CVD treatment is performed using unsaturated hydrocarbon gas under conditions in which the film thickness of the amorphous carbon film is about 200 to 2,000 nm, preferably about 400 to 1,000 nm. As the method for forming an amorphous carbon film, a known method can be used as it is. For example, a rubber-metal laminated gasket is placed on an electrode in a vacuum chamber of a low-pressure plasma treatment device, and the vacuum chamber is evacuated to a degree of vacuum of about 5 to 50 Pa. Then, unsaturated hydrocarbon gas, such as acetylene gas, ethylene gas, or propylene gas, is introduced into the vacuum chamber until the degree of vacuum is about 6 to 100 Pa. While maintaining the pressure in the vacuum chamber at about 6 to 100 Pa, for example, a high-frequency power with an output of about 300 to 3,000 W is supplied from a high-frequency power source at a frequency of 40 kHz, 13.56 MHz, or the like, and a high-frequency voltage is applied to the other electrode for about 0.1 to 60 minutes to convert the hydrocarbon gas into a plasma, thereby forming an amorphous carbon film on the rubber-metal laminated plate. The output is not limited to this range, because it depends on the size of the device. For example, when the output is as low as about 200 W, the wear resistance in a high temperature environment cannot be improved.

The amorphous carbon film formed by the above process has a nanoindentation hardness on a silicon wafer of 10 GPa or more, preferably 15 GPa or more, and a film thickness of 200 nm or more, preferably 400 nm or more; therefore, the amorphous carbon film-formed rubber-metal laminated plate, which uses a stainless steel plate as the metal plate, can be effectively used as an engine cylinder head gasket.

Patent Document 2, mentioned above, refers to acetylene gas as the plasma raw material gas used to form a carbon film in the general description; however, the gas used in each Example is only methane gas, and the use of fluororubber as the substrate is merely mentioned as an illustration. Furthermore, Patent Document 3, mentioned above, refers to fluororubber as the polymer substrate in the general description, and to acetylene as the hydrocarbon used to form a DLC film; however, they are merely mentioned as illustrations.

In the present invention, an amorphous carbon film is formed on the outer surface of a fluororubber or nitrile rubber layer by a plasma CVD method using unsaturated hydrocarbon gas, preferably unsaturated hydrocarbon gas having a double bond, such as ethylene gas or propylene gas; thereby, it is possible to provide a rubber-metal laminated gasket material, wherein the wear and abrasion of the gasket material due to friction with the seal mating surface under conditions using high temperature are reduced.

As shown in Examples, provided later, such an effect is exhibited by forming an amorphous carbon film that has a nanoindentation hardness on a silicon wafer of 10 GPa or more, preferably 15 GPa or more, and a film thickness of 200 nm or more, preferably 400 nm or more, on the outer surface of a fluororubber or nitrile rubber layer by a plasma CVD method using unsaturated hydrocarbon gas, regardless of the presence or absence of a pretreatment (termination treatment) before the DLC film formation, or the formation of an intermediate layer film, as is different from Patent Documents 2 and 3.

Therefore, it is sufficient for the present invention that an amorphous carbon film is formed on the outer surface of the rubber layer. That is, the present invention includes a gasket material in which an amorphous carbon film is directly formed on the rubber surface without performing a pretreatment, such as a termination treatment, etc., a gasket material in which the rubber surface is previously subjected to a plasma modification treatment before the formation of an amorphous carbon film, and a gasket material in which an intermediate layer film is provided between rubber and an amorphous carbon film; however, in terms of the simplification of the structure, etc., it is preferable to use one in which an amorphous carbon film is directly formed on the outer surface of the rubber layer without providing an intermediate layer film.

Moreover, when a pretreatment is applied to the outer surface of the rubber layer prior to the plasma CVD treatment using unsaturated hydrocarbon gas, such as acetylene gas, a plasma treatment using non-polymerizable gas or inert gas (e.g., Ar, $N_2$, $H_2$, or $O_2$) can be performed, or a plasma treatment using a mixed gas comprising unsaturated hydrocarbon gas, such as acetylene gas, and non-polymerizable gas or inert gas (e.g., Ar), mentioned above, at a volume ratio of 1 to 10:10 to 1 can also be performed, in terms of high temperature resistant stickiness.

EXAMPLES

The following describes the present invention with reference to Examples.

Example 1

Rubber-metal laminated gasket materials were produced by the following procedures.

[Production of a Fluororubber-Metal Laminated Gasket Material]

The surface of a SUS301 stainless steel plate (thickness: 0.2 mm) was degreased with methyl ethyl ketone. Then, a fluororubber compound to which an adhesive component was added (Formulation Example I, mentioned above) was applied to the surface, and crosslinking was performed in an oven at 220° C. for 3 minutes, thereby obtaining a fluororubber-metal laminated gasket material (test piece: 80×15×0.2 mm).

[Production of a Nitrile Rubber-Metal Laminated Gasket Material]

The surface of a SUS301 steel plate (thickness: 0.2 mm) was degreased with alkali. Then, a silane-based undercoat adhesive was applied to the surface so that the coating weight was 250 mg/m$^2$, followed by calcination at 220° C. for 5 minutes. Subsequently, a phenolic resin-based covercoat adhesive (Chemlok 202, produced by Lord Far East, Inc.) was applied thereto, followed by calcination at 210° C. for 5 minutes. Thereafter, a 25 wt. % mixed organic solvent (weight ratio of toluene:methyl ethyl ketone=9:1) solution of a nitrile rubber compound (Formulation Example V, mentioned above) was applied to the covercoat adhesive layer on the SUS301 stainless steel plate, and dried at 60° C. for 15 minutes to form an uncrosslinked rubber layer (thickness on one side: 20 μm). Then, pressure crosslinking was performed at 180° C. at 60 kgf/m$^2$ (5.88 MPa) for 10 minutes, thereby obtaining a nitrile rubber-metal laminated gasket material (test piece: 80×15×0.2 mm).

Next, the rubber-metal laminated gasket was placed on a lower electrode in a vacuum chamber of a low-pressure plasma treatment device so that the rubber surface turned upward, and the vacuum chamber was evacuated to a degree of vacuum of 8 Pa. Acetylene gas was introduced into the vacuum chamber until the degree of vacuum was 10 Pa. While maintaining the pressure in the vacuum chamber at about 10 Pa, a high-frequency power with an output of 900 W was applied to the other electrode from a high-frequency (40 kHz) power source for 10 minutes, while applying a high-frequency voltage, to convert the acetylene gas into a plasma, thereby forming an amorphous carbon film on the rubber-metal laminated plate. In the low-pressure plasma CVD treatment device used herein, an upper electrode and a lower electrode were placed, respectively, in the upper side and lower side of the inside of a vacuum chamber providing a gas supply portion and a gas discharge device on the outer side surface thereof. The lower electrode was connected to the high-frequency power source disposed outside the vacuum chamber, and the upper electrode was provided with a ground wire to the outside of the vacuum chamber. Further, as a test piece for evaluation, a low-pressure plasma-treated silicon wafer test piece in which an amorphous carbon film was similarly formed on the surface thereof was also formed in the chamber.

The heat resistance of the rubber-metal laminated gasket materials (test pieces) in which an amorphous carbon film was formed on the surface thereof was evaluated. Further, using the silicon wafer test piece in which an amorphous carbon film was formed on the surface thereof, the film thickness and film hardness of the amorphous carbon film were evaluated.

Evaluation of heat resistance: The rubber-metal laminated gasket material was exposed to heated air at 200° C. for 72 hours, and then reciprocated between an angle of 35.8° using a friction player (FPR-2000, produced by Rhesca Co., Ltd.) under the following conditions: a SUJ2 pin (diameter: 5 mm), load: 500 g (for fluororubber) or 5,000 g (for nitrile rubber), radius of rotation: 40 mm, and rotational speed: 15 rpm. The number of times of reciprocation until the coating rubber was removed and the metal was exposed was measured.

The number of times of reciprocation required for the use as an engine cylinder head gasket is 80 or more, but is preferably 200 or more, more preferably 300 or more.

Film thickness: The polarization state of the silicon wafer test piece was measured using a spectral ellipsometer (UVI-SEL, produced by Horiba, Ltd.) under the following conditions: incident angle: 70 degrees, wavelength range: 2,066 to 248 nm, and spot diameter: 1 mm×3 mm ellipse. Then, the coating thickness of the amorphous carbon film on the silicon wafer was calculated.

Spectral ellipsometry is an analytical method for determining sample film thickness (d) and optical constant (refractive index n and extinction coefficient k) in the following manner. Specifically, when linearly polarized light enters, the polarization state is changed depending on the film thickness (d) of the sample and the optical constant (refractive index n and extinction coefficient k), and the linearly polarized light is converted to elliptically polarized light whose phases are randomly shifted. The variation amount of the polarization state is measured to determine the sample film thickness (d) and the optical constant (refractive index n and extinction coefficient k).

The film thickness desired for the use as an engine cylinder head gasket is 200 nm or more, preferably 400 nm or more.

Film hardness: Using a Nano Indenter G200 (produced by Agilent Technologies), the silicon wafer test piece was pressed to a depth of 200 nm by CSM measurement with a magnitude of 2 nm and a strain of 0.05/sec, and the coating hardness of the amorphous carbon film on the silicon wafer at a depth of 50 nm was calculated.

The film hardness desired for the use as an engine cylinder head gasket is 10 GPa or more, preferably 15 GPa or more.

It is difficult to accurately measure the hardness of an amorphous carbon film formed on rubber because the rubber is an elastic body; however, the measurement of the hardness of an amorphous carbon film formed on a silicon wafer makes it possible to accurately grasp the hardness of the film itself.

Example 2

In Example 1, a low-pressure plasma treatment was performed while ethylene gas was used in place of the acetylene gas, and the degree of vacuum was changed to 20 Pa, respectively.

Example 3

In Example 1, a low-pressure plasma treatment was performed while propylene gas was used in place of the acetylene gas, and the degree of vacuum was changed to 20 Pa, respectively.

Comparative Example 1

In Example 1, a low-pressure plasma treatment using a high-frequency power was performed while the output was changed to 200 W.

Comparative Example 2

In Example 2, a low-pressure plasma treatment using a high-frequency power was performed while the output was changed to 200 W.

Comparative Example 3

In Example 3, a low-pressure plasma treatment using a high-frequency power was performed while the output was changed to 200 W.

Comparative Example 4

In Example 1, a low-pressure plasma treatment was performed while methane gas was used in place of the acetylene gas, and the degree of vacuum was changed to 20 Pa, respectively.

Comparative Example 5

In Comparative Example 4, a low-pressure plasma treatment using a high-frequency power was performed while the output was changed to 200 W.

Comparative Example 6

In Example 1, a low-pressure plasma treatment using a high-frequency power was not performed.

Results of the foregoing Examples and Comparative Examples are shown in the following Table.

TABLE

| Measurement item | Ex. | | | Comp. Ex. | | | | | |
| --- | --- | --- | --- | --- | --- | --- | --- | --- | --- |
| | 1 | 2 | 3 | 1 | 2 | 3 | 4 | 5 | 6 |
| [Rubber-metal laminated plate] Evaluation of heat resistance (number of times) | | | | | | | | | |
| Fluororubber | >300 | >300 | >300 | 40 | 49 | 64 | 50 | 54 | 45 |
| Nitrile rubber | >300 | >300 | >300 | 23 | 2 | 1 | 1 | 1 | 1 |

TABLE-continued

| | Ex. | | | Comp. Ex. | | | | | |
|---|---|---|---|---|---|---|---|---|---|
| Measurement item | 1 | 2 | 3 | 1 | 2 | 3 | 4 | 5 | 6 |
| [Silicon wafer] | | | | | | | | | |
| Film thickness (nm) | 433 | 522 | 555 | 489 | 386 | 380 | 137 | 90 | — |
| Hardness (GPa) | 14.5 | 16.6 | 16.5 | 9.7 | 9.7 | 8.7 | 14.3 | 13.2 | — |

The invention claimed is:

1. A rubber-metal laminated gasket material comprising a metal plate and fluororubber or nitrile rubber laminated on the metal plate, wherein an amorphous carbon film having a nanoindentation hardness on a silicon wafer of 10 GPa or more and a film thickness of 200 nm or more is formed on a rubber layer outer surface of the rubber-metal laminated gasket material by a plasma CVD method that supplies a high-frequency power with an output of 300 W or more from a high-frequency power source using unsaturated hydrocarbon gas.

2. The rubber-metal laminated gasket material according to claim 1, wherein the unsaturated hydrocarbon gas is acetylene gas, ethylene gas, or propylene gas.

3. The rubber-metal laminated gasket material according to claim 2, which has an adhesive layer between the rubber layer and the metal plate.

4. The rubber-metal laminated gasket material according to claim 2, wherein the rubber layer contains an adhesive component.

5. The rubber-metal laminated gasket material according to claim 2, which is used as an engine cylinder head gasket.

6. The rubber-metal laminated gasket material according to claim 1, which has an adhesive layer between the rubber layer and the metal plate.

7. The rubber-metal laminated gasket material according to claim 1, wherein the rubber layer contains an adhesive component.

8. The rubber-metal laminated gasket material according to claim 1, which is used as an engine cylinder head gasket.

9. An engine cylinder head gasket comprising the rubber-metal laminated gasket material according to claim 8.

* * * * *